United States Patent
Suga et al.

(10) Patent No.: US 11,843,068 B2
(45) Date of Patent: Dec. 12, 2023

(54) PHOTOELECTRIC CONVERSION ELEMENT AND PHOTOELECTRIC CONVERSION SYSTEM

(71) Applicant: CANON KABUSHIKI KAISHA, Tokyo (JP)

(72) Inventors: Takako Suga, Kanagawa (JP); Takeshi Uchida, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 17 days.

(21) Appl. No.: 17/125,631

(22) Filed: Dec. 17, 2020

(65) Prior Publication Data
US 2021/0202775 A1 Jul. 1, 2021

(30) Foreign Application Priority Data
Dec. 26, 2019 (JP) ................. 2019-236001

(51) Int. Cl.
*H01L 31/054* (2014.01)
*H01L 27/146* (2006.01)

(52) U.S. Cl.
CPC .... *H01L 31/0547* (2014.12); *H01L 27/14629* (2013.01)

(58) Field of Classification Search
CPC ........... H01L 31/02327; H01L 31/0547; H01L 27/146; H01L 27/1462; H01L 27/14625; H01L 27/14629
See application file for complete search history.

(56) References Cited

U.S. PATENT DOCUMENTS

| | | | |
|---|---|---|---|
| 2006/0091284 A1 | 5/2006 | Viens | |
| 2011/0037825 A1* | 2/2011 | Jikutani | H01L 33/10 372/45.01 |
| 2011/0064110 A1* | 3/2011 | Gerlach | H01S 5/18347 372/50.21 |
| 2014/0247853 A1* | 9/2014 | Deppe | H01S 5/18305 372/50.11 |
| 2017/0309757 A1 | 10/2017 | Engel | |
| 2017/0345958 A1 | 11/2017 | Meyer | |

FOREIGN PATENT DOCUMENTS

| | | |
|---|---|---|
| JP | 2003508876 A | 3/2003 |
| JP | 2006156870 A | 6/2006 |
| JP | 2010021337 A | 1/2010 |
| JP | 2014192488 A | 10/2014 |

* cited by examiner

*Primary Examiner* — Mayla Gonzalez Ramos
(74) *Attorney, Agent, or Firm* — CANON U.S.A., INC. IP Division

(57) ABSTRACT

A photoelectric conversion element includes a first reflecting mirror provided on a substrate, a resonator provided on the first reflecting mirror, and a second reflecting mirror provided on the resonator. The first reflecting mirror includes a distributed Bragg reflector (DBR) including a plurality of semiconductor layers. A photoelectric conversion layer is provided in at least one layer of the plurality of semiconductor layers.

13 Claims, 14 Drawing Sheets

PHOTOELECTRIC CONVERSION ELEMENT AND PHOTOELECTRIC CONVERSION SYSTEM

BACKGROUND

Technical Field

One disclosed aspect of the embodiments relates to a resonator-type photoelectric conversion element and a photoelectric conversion system.

Description of the Related Art

There is known a resonator-type photoelectric conversion element with a photoelectric conversion layer sandwiched between two reflecting mirrors.

For example, Japanese Patent Application Laid-Open No. 2014-192488 discusses a resonator-type photoelectric conversion element including a distributed Bragg reflector (DBR), an indium gallium arsenide antimonide (InGaAsSb) photoelectric conversion layer, and indium gallium arsenide (InGaAs) on an indium phosphide (InP) substrate. In the above-described DBR, InP and InGaAsP are alternately layered to form a lower reflecting mirror. Further, an upper reflecting mirror is formed by an interface between the above-described InGaAs layer and air.

In the resonator-type photoelectric conversion element, light targeted for detection reciprocates through the photoelectric conversion layer a number of times due to the resonance effect, and therefore the sensitivity can be secured even when the photoelectric conversion layer is as thin as approximately several tens of nanometers. Further, because the thickness of the photoelectric conversion layer can be reduced, the resonator-type photoelectric conversion element can reduce dark current compared to a photoelectric conversion device including a thick photoelectric conversion layer. Therefore, the resonator-type photoelectric conversion element can reduce dark current while maintaining the sensitivity.

SUMMARY

According to an aspect of the embodiments, a photoelectric conversion element includes a photoelectric conversion layer, a first reflecting mirror on a substrate, a resonator on the first reflecting mirror, and a second reflecting mirror on the resonator. The first reflecting mirror includes a distributed Bragg reflector (DBR) including a plurality of semiconductor layers. The photoelectric conversion layer is provided in at least one layer of the plurality of semiconductor layers.

Further features of the disclosure will become apparent from the following description of exemplary embodiments with reference to the attached drawings.

DESCRIPTION OF THE EMBODIMENTS

Figure 1:
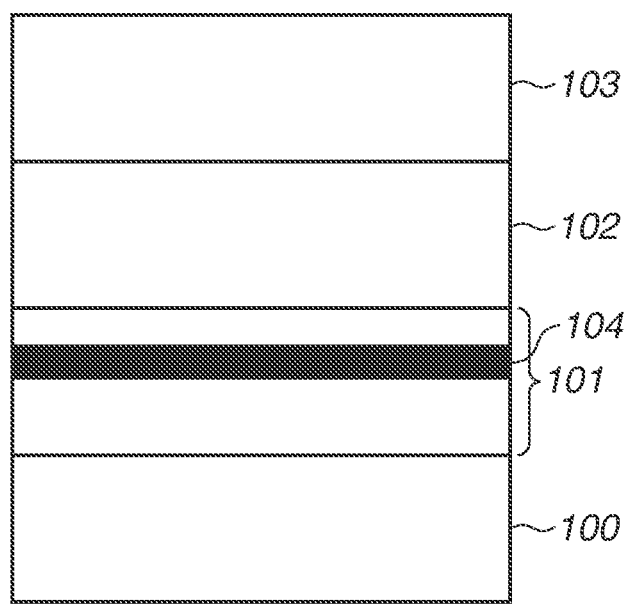
FIG. 1 illustrates a photoelectric conversion element according to a first exemplary embodiment.

According to an embodiment, a high-performance resonator-type photoelectric conversion element is provided.

In the following description, exemplary embodiments of the disclosure will be described with reference to the drawings. Any of the exemplary embodiments that will be described below shows merely an example of the disclosure, and is not intended to limit the disclosure regarding numerical values, shapes, materials, components, a layout and a connection configuration of the components, and the like. Further, in the drawings that will be described below, elements having similar functions may be identified by the same reference numerals, and the descriptions thereof may be omitted or simplified. Further, terms indicating directions, such as "upper" and "lower", are derived from the fact that the element is formed from the lower side to the upper side, and "lower" and "upper" will be used to refer to one side on which the substrate is located and the opposite side therefrom, respectively. Therefore, these terms are not related to vertically upper and lower sides when the element is set up.

The disclosure can be modified in various manners without being limited to the exemplary embodiments that will be described below. Further, the exemplary embodiments of the disclosure also include examples in which a part of the configuration of any of the exemplary embodiments is added to another exemplary embodiment or is replaced with a part of the configuration of another exemplary embodiment. In other words, the disclosure can be implemented in various manners without departing from the technical idea thereof or the main features thereof.

Figure 9:
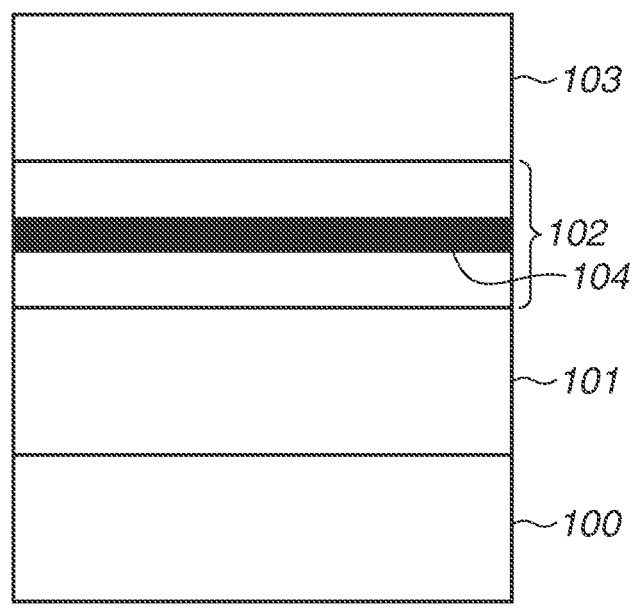
FIG. 9 illustrates a comparative example.

First, a resonator-type photoelectric conversion element serving as a comparative example will be described with reference to FIG. 9. A first reflecting mirror (lower reflecting mirror) 101, a resonator 102 including a photoelectric conversion layer 104, and a second reflecting mirror (upper reflecting mirror) 103 are formed on a substrate 100 in this order. In the resonator-type photoelectric conversion element, the photoelectric conversion layer 104 may be provided so as to be positioned at an anti-node of a light intensity distribution formed in the resonator 102 to improve the sensitivity.

In this case, in a case where the second reflecting mirror 103 is made of, for example, a metallic member, metallic diffusion from the metallic member may cause a reduction in the crystallinity of the photoelectric conversion layer 104 and the like and thus a reduction in the sensitivity when the temperature increases during the process. This problem becomes noticeable when the distance between the metallic member and the photoelectric conversion layer 104, i.e., the distance between the interface between the resonator 102 and the second reflecting mirror 103 and the photoelectric conversion layer 104 is short.

Further, even in a case where the second reflecting mirror 103 is made of a dielectric distributed Bragg reflector (DBR), the photoelectric conversion layer 104 may incur damage and lead to a reduction in the sensitivity if the second reflecting mirror 103 or a member formed on the second reflecting mirror 103 is processed by dry etching or the like. Further, in a case where a metallic member used as an electrode is formed on the resonator 102, metallic diffusion from the metallic member may cause a reduction in the crystallinity of the photoelectric conversion layer 104 and the like and thus a reduction in the sensitivity when the temperature increases during the process. These problems also become noticeable when the distance between the interface between the resonator 102 and the second reflecting mirror 103 and the photoelectric conversion layer 104 is short. Therefore, the present exemplary embodiments will be described focusing on a method for solving the above-described problems.

Figure 11:
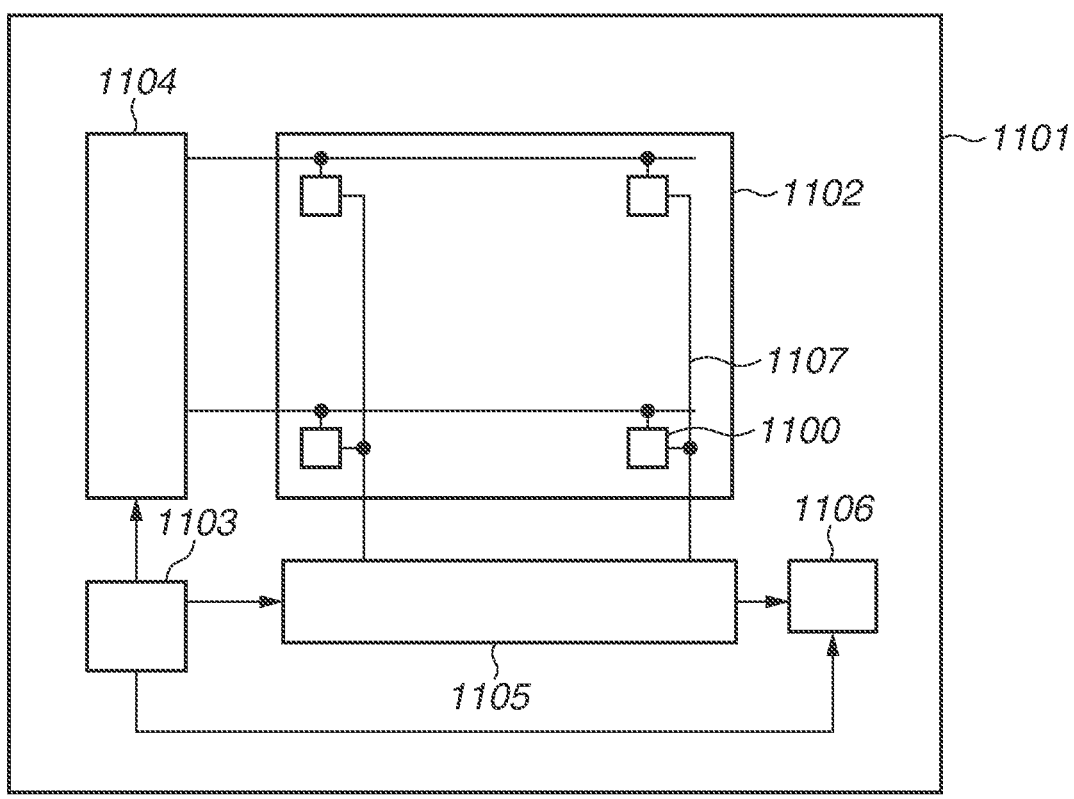
FIG. 11 is a block diagram illustrating the example 1.

FIG. 11 is a block diagram illustrating a photoelectric conversion apparatus 1101, which is a first exemplary embodiment of the disclosure. The photoelectric conversion apparatus 1101 includes a pixel unit 1102, a driving pulse generation unit 1103, a vertical scanning circuit 1104, a signal processing unit 1105, an output unit 1106, and vertical signal lines 1107.

A plurality of pixels 1100 is included in the pixel unit 1102. The plurality of pixels 1100 is arranged in a matrix form, and are laid out into an array. A photoelectric conversion element, which converts light into an electric signal, is provided to each of the plurality of pixels 1100. A plurality of vertical signal lines 1107 is disposed, and each of the vertical signal lines 1107 is arranged for each pixel column of the plurality of pixels 1100. The driving pulse generation unit 1103 generates a driving pulse, and the vertical scanning circuit 1104 receives the driving pulse from the driving pulse generation unit 1103 and supplies a control pulse to each of the pixels 1100.

Signals output in parallel via the vertical signal lines 1107 are input to the signal processing unit 1105. Then, the signal processing unit 1105 serializes the signals output in parallel from a plurality of pixel columns and transmits the signals to the output unit 1106. The signal processing unit 1105 may include a column circuit in charge of signal amplification, an analog-to-digital (AD) conversion, and/or the like. Further, the photoelectric conversion apparatus 1101 may have a layered structure.

FIG. 1 illustrates the photoelectric conversion element according to the present exemplary embodiment. The first reflecting mirror 101, the resonator 102, and the second reflecting mirror 103 are formed on the substrate 100. As illustrated in FIG. 1, the photoelectric conversion layer 104 is not provided in the resonator 102 and is arranged on the substrate 100 side with respect to the resonator 102 in the present exemplary embodiment. More specifically, the photoelectric conversion layer 104 is arranged in the first reflecting mirror 101 in FIG. 1. This is a difference from the comparative example. Light received by the photoelectric conversion element may be light incident from the substrate 100 side or may be light incident from the upper side of the second reflecting mirror 103.

<Resonator>
An optical film thickness L of the resonator 102 satisfies an inequality (1).

$$\frac{3}{8}\lambda 0 + \frac{m}{2}\lambda 0 \le L \le \frac{5}{8}\lambda 0 + \frac{m}{2}\lambda 0 \tag{1}$$

(m is an integer equal to or larger than 0)

In this inequality, $\lambda 0$ represents a wavelength at which the sensitivity characteristic is maximized when the sensitivity characteristic to each wavelength is acquired with respect to the photoelectric conversion element, and a design wavelength of the resonator 102 with respect to each wavelength.

In the present disclosure, the lower end of the resonator 102 is defined to be the boundary between the uppermost layer among layers forming the first resonating mirror 101 and the resonator 102. Further, the upper end of the resonator 102 is defined to be the boundary between the resonator 102 and the lowermost layer among layers forming the second reflecting mirror 103. The effective reflection surface may coincide with the above-described upper end and lower end, but may not coincide with these boundaries, for example, when the reflecting mirror is a DBR reflecting mirror. Therefore, as indicated by the above-described inequality (1), the optical film thickness L of the resonator 102 is set to a film thickness acquired by adding an optical film thickness of $\pm\lambda/8$ to an integral multiple of $0.5\lambda$.

For example, if m=0 in the above-descried inequality (1), the above-described inequality (1) is simplified in the following manner, and a $0.5\lambda$ resonator is indicated therefrom.

$$\frac{3}{8}\lambda 0 \le L \le \frac{5}{8}\lambda 0 \tag{2}$$

Further, for example, if m=1, the above-described inequality (1) is simplified in the following manner, and a $1.0\lambda$ resonator is indicated therefrom.

$$\frac{7}{8}\lambda 0 \le L \le \frac{9}{8}\lambda 0 \tag{3}$$

Further, for example, if m=2, the above-described inequality (1) is simplified in the following manner, and a $1.5\lambda$ resonator is indicated therefrom.

$$\frac{11}{8}\lambda 0 \le L \le \frac{13}{8}\lambda 0 \tag{4}$$

Further, the following inequality is presented as an inequality that further limits the range of L expressed by the above-described inequality (1).

$$\frac{7}{16}\lambda 0 + \frac{m}{2}\lambda 0 \le L \le \frac{9}{16}\lambda 0 + \frac{m}{2}\lambda 0 \tag{5}$$

(m is an integer equal to or larger than 0)
More specifically, the above-described inequality (1) is an inequality indicating the optical film thickness of (optical film thickness based on the typical model)$\pm\lambda/8$, while the above-described inequality (5) is an inequality indicating the optical film thickness of (optical film thickness based on the typical model)$\pm\lambda/16$, and serves as an inequality that further limits the range of the optical film thickness L.

The resonator 102 is basically formed by a continuous film made from a single substance except for the photoelectric conversion layer 104. However, the resonator 102 may include a layer having a thickness not causing this layer to significantly affect the optical characteristic. More specifically, the resonator 102 may include a film such as an etching stop film for changing the resonator length depending on the position and a carrier block layer.

<Second Reflecting Mirror>

The second reflecting mirror 103, which is the upper reflecting mirror, is formed by a single layer or a plurality of layers designed so as to increase the reflectance for the wavelength λ0. For example, the second reflecting mirror 103 is formed by a single layer made from metal, a plurality of layers including metal, or a DBR. The DBR is formed by alternately layering a first layer and a second layer having refractive indexes different from each other, and may be formed by alternately layering dielectric layers or by alternately layering semiconductor layers.

Further, assuming that Th represents the optical film thickness of the first layer, which is a layer having a high refractive index, and Tl represents the optical film thickness of the second layer, which is a layer having a low refractive index, these optical film thicknesses satisfy a condition expressed by an equation (6).

$$Th+Tl=M\cdot \lambda t/2 \ (M \text{ is a natural number}) \quad (6)$$

In this equation, λt represents the design wavelength of the second reflecting mirror 103. The second reflecting mirror 103 has a band of a predetermined reflectance or higher with respect to each wavelength, and the approximately central wavelength of this band corresponds to the design wavelength of the second reflecting mirror 103.

Although Th and Tl are typically optical film thicknesses of λt/4, the second reflecting mirror 103 may be an alternately layered film of layers having an optical film thickness of λt/8 and an optical film thickness of 3λt/8 as long as Th and Tl satisfy the above-described equation (6).

In the above-described manner, λt and λ0 do not have to be the same wavelength. The photoelectric conversion element is designed in such a manner that λ0 falls within the band of the predetermined reflectance or higher exhibited by the second reflecting mirror 103. For example, the predetermined reflectance is 10% or higher. More desirably, the predetermined reflectance is 15% or higher. However, λt and λ0 may be the same wavelength.

In the case where the second reflecting mirror 103 is made of the metallic film, a surface of the metallic film on the substrate 100 side serves as the boundary surface between the second reflecting mirror 103 and the resonator 102 (end surface of the second reflecting mirror 103). On the other hand, in the case where the second reflecting mirror 103 is made of the DBR, in the alternately layered film satisfying the condition expressed by the equation (6), a surface on the substrate 100 side of the layer closest to the substrate 100 side in this alternately layered film serves as the boundary surface between the second reflecting mirror 103 and the resonator 102 (end surface of the second reflecting mirror 103).

<First Reflecting Mirror>

The first reflecting mirror 101, which is the lower reflecting mirror, is formed by a DBR including semiconductor layers. Similar to the above-described equation (6), an optical film thickness corresponding to one pair, which is a sum of the optical film thickness of the first layer and the optical film thickness of the second layer, is set to a natural-number multiple of a half of a setting wavelength λb of the first reflecting mirror 101. The setting wavelength λb of the first reflecting mirror 101 may be different from the wavelength λ0. However, the photoelectric conversion element is designed in such a manner that λ0 falls within the band of a predetermined reflectance or higher exhibited by the first reflecting mirror 101. For example, the predetermined reflectance is 10% or higher. More desirably, the predetermined reflectance is 15% or higher.

<Photoelectric Conversion Layer>

The photoelectric conversion layer 104 is made from a material having a band gap smaller than a band gap equivalent to the energy of a photon of the wavelength a. The position at which the photoelectric conversion layer 104 is disposed is set to a position at which a depletion layer is formed when a voltage of a reverse bias is applied to operate as the photoelectric conversion element. For this purpose, semiconductor layers having conductivity types different from each other are provided, formed, disposed, positioned, or located above and under the photoelectric conversion layer 104. For example, in a case where a negative (n-type) semiconductor layer is provided, formed. disposed, positioned, or located under the photoelectric conversion layer 104, a positive (p-type) semiconductor layer is provided, formed, disposed, positioned, or located above the photoelectric conversion layer 104. An electrode (not illustrated) is provided to the semiconductor layer to apply the voltage of the reverse bias.

Due to diffusion of doping elements of the semiconductor layers provided, disposed, positioned, or located above and under the photoelectric conversion layer 104, a defect or the like may occur in the photoelectric conversion layer 104 and lead to a reduction in the photoelectric conversion sensitivity and/or an increase in the dark current. In this case, the photoelectric conversion layer 104 may be formed as an intrinsic (i-type) semiconductor layer, and an i-type semiconductor layer may be provided as each of the layer immediately above and the layer immediately below the photoelectric conversion layer 104. Herein, the i-type semiconductor layer refers to a non-doped (undoped) semiconductor layer. The term "non-doped (undoped)" means that the semiconductor layer is intentionally undoped with dopant (impurity) to control the conductivity type while the semiconductor layer is growing. For example, the dopant concentration in the i-type semiconductor layer is $1\times10^{16}$ cm$^{-3}$ or lower.

As described above, the photoelectric conversion layer 104 is disposed on the substrate 100 side with respect to the resonator 102 in the present exemplary embodiment. This layout allows the photoelectric conversion element to secure the distance between the interface between the resonator 102 and the second reflecting mirror 103 and the photoelectric conversion layer 104. As a result, the influence on the photoelectric conversion layer 104 can be reduced.

Descriptions of Other Advantageous Effects

Increasing the resonator length of the resonator 102 is also possible as a method for reducing the influence exercised on the photoelectric conversion layer 104. However, increasing the resonator length of the resonator 102 leads to a reduction in the sensitivity. A simulation of calculating a photoelectric conversion sensitivity curve was conducted using the transfer matrix method to confirm the influence when the resonator length was increased.

The first reflecting mirror 101 as the simulation model was a DBR including five pairs of alternately layered indium phosphide (InP) layers and indium gallium arsenide phosphide (InGaAsP) layers. The central wavelength (design wavelength) of the reflection band of the DBR was set to 1.52 μm. Further, the resonator 102 was configured to include the photoelectric conversion layer 104 formed by an indium gallium arsenide (InGaAs) layer having a thickness of 70 nm at the position of the anti-node of the light intensity distribution formed inside the resonator 102.

The resonator 102 was configured to include InP layers as the rest of the layers, and have an optical film thickness of 1.52 μm including the photoelectric conversion layer 104. The design wavelength was 1.52 μm, which meant that the resonator 102 was the 1.02λ resonator. The second reflecting mirror 103 was a DBR including 4.5 pairs of alternately layered titanium dioxide (TiO₂) layers and silicon dioxide (SiO₂) layers. The central wavelength of the reflection band of the DBR was 1.45 μm.

Figure 10:
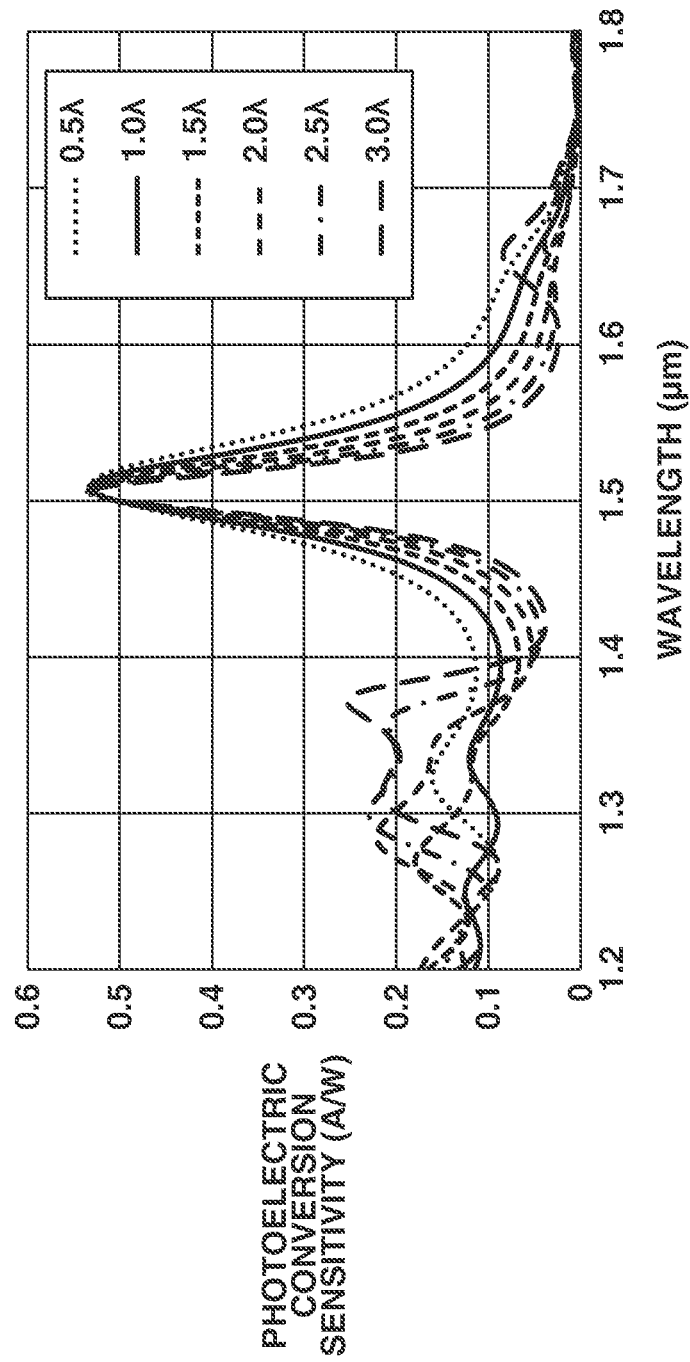
FIG. 10 illustrates a photoelectric conversion sensitivity curve when a resonator length is changed.

FIG. 10 illustrates the wavelength dependency of the photoelectric conversion sensitivity curve obtained by the simulation. The horizontal axis represents the wavelength, and the vertical axis represents the photoelectric conversion sensitivity. The photoelectric conversion sensitivity refers to the ratio between an incident light amount and a photocurrent when the incident light amount and the photocurrent are expressed in watt (W) and ampere (A), respectively, and the unit of the photoelectric conversion sensitivity is A/W. It can be seen that the value of the half width of the photoelectric conversion sensitivity curve at the design wavelength reduces as the resonator length of the resonator 102 increases.

Assuming that the half width corresponding to the resonator length of 1.02λ is 1, the half width when the resonator length increases is standardized and is written in a table 1 as the photoelectric conversion sensitivity ratio.

TABLE 1

| | Resonator Length | | | | | |
| --- | --- | --- | --- | --- | --- | --- |
| | 0.5λ | 1.0λ | 1.5λ | 2.0λ | 2.5λ | 3.0λ |
| Photoelectric Conversion Sensitivity Ratio | 1.21 | 1.00 | 0.79 | 0.67 | 0.58 | 0.50 |

It can be understood from the table 1 that increasing the resonator length to one and a half times causes the half width of the photoelectric conversion sensitivity ratio to reduce by approximately 20 percent, resulting in a reduction in the photoelectric conversion sensitivity. Further, it can be understood from the table 1 that increasing the resonator length to three times causes the half width of the photoelectric conversion sensitivity ratio to reduce by approximately half, resulting in a reduction in the photoelectric conversion sensitivity.

In other words it is also desirable in the present exemplary embodiment that the resonator 102 is configured as a 2.0λ or shorter resonator. For example, desirably, the resonator 102 is configured to be any of the 2.0λ resonator, the 1.5λ resonator, the 1.0λ resonator, and the 0.5λ resonator. In other words, desirably, m is set to be 0, 1, 2, or 3 in the above-described inequality (1). More desirably, the resonator 102 is configured to be the 1.0λ resonator or the 0.5λ resonator. In other words, desirably, m is set to be 0 or 1 in the above-described inequality (1).

Figure 2A:
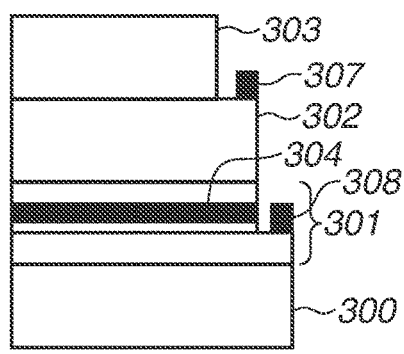
FIGS. 2A, 2B, and 2C illustrate an example 1.
Figures 2B, 2C:
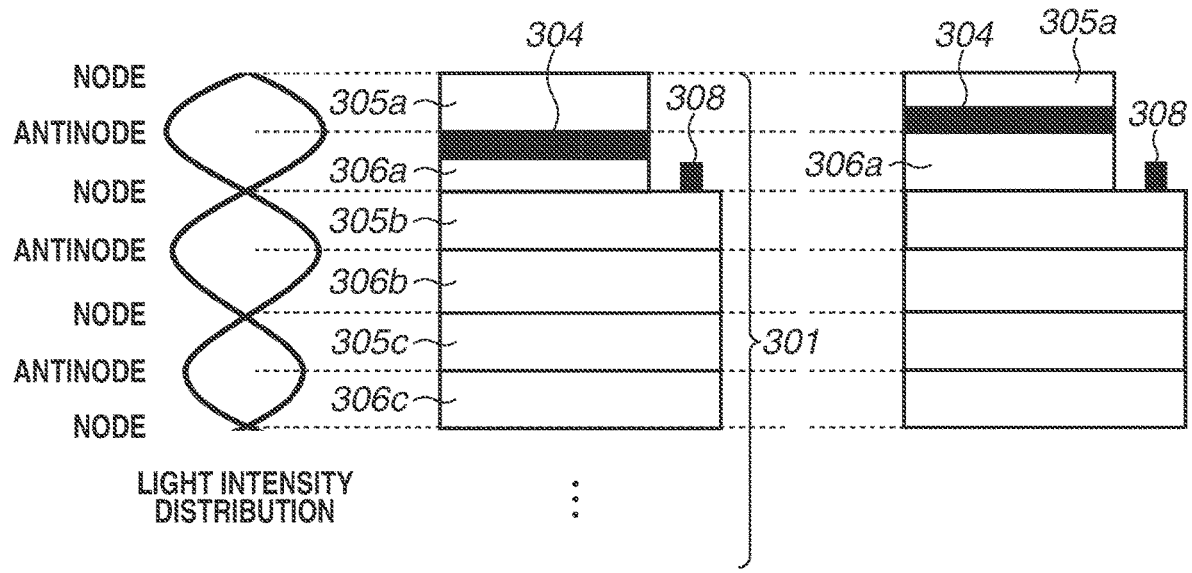

FIG. 2A illustrates a cross-sectional view of a photoelectric conversion element according to an example 1. Further, FIG. 2B illustrates details of a part of FIG. 2A. In the present example, the wavelength λ0 is set to 1.52 μm.

In FIG. 2A, a first reflecting mirror 301, a resonator 302, and a second reflecting mirror 303 are formed on an InP substrate 300 in this order. The first reflecting mirror 301 is a semiconductor DBR formed by alternately layering an InGaAsP layer and an InP layer. In one embodiment, the first reflecting mirror 301 is formed, disposed, positioned or located directly above the substrate 300. The resonator 302 is a p-type InP layer, and the thickness thereof is, for example, approximately 480 nm. In one embodiment, the resonator 302 is formed, disposed, positioned or located directly above the first reflecting mirror 301. The second reflecting mirror 303 is a dielectric DBR formed by alternately layering a TiO₂ layer and an SiO₂ layer. In one embodiment, the second reflecting mirror 303 is formed, disposed, positioned or located directly above the resonator 302. The setting wavelength of the second reflecting mirror 303 is 1.60 μm. The photoelectric conversion layer 304 is an InGaAs layer, and the thickness thereof is, for example, approximately 70 nm. The photoelectric conversion layer 304 is provided in the first reflecting mirror 301.

The position at which the photoelectric conversion layer 304 is disposed will be described in detail with reference to FIG. 2B. The left side of FIG. 2B schematically illustrates a light intensity distribution existing in the first reflecting mirror 301.

FIG. 2B illustrates a part of the layers forming the first reflecting mirror 301 as an example, and does not illustrate all the layers. The first reflecting mirror 301 is formed by alternately layering an InGaAsP layer 305 having a thickness of approximately 110 nm and an InP layer 306 having a thickness of approximately 120 nm. Further, alphabets added at the ends of the reference numerals 305 and 306 are indexes used to identify each pair forming the DBR. For example, "a" means the first pair closest to the resonator 302. Further, "b" means the second pair next closest to the resonator 302. In this manner, the DBR includes at least a plurality of pairs of two layers having different refractive indexes.

The photoelectric conversion layer 304 is provided or disposed so as to replace a part of the InP layer 306a therewith. More specifically, a part of the uppermost layer among the plurality of InP layers 306 is replaced with the photoelectric conversion layer 304. In this case, the photoelectric conversion layer 304 and InP layer 306a are configured in such a manner that the optical film thickness as a sum of these two layers has a design value equal to the other InP layers 306b, 306c, and the like. For example, if the thickness of the photoelectric conversion layer 304 is 70 nm (optical film thickness: 245 nm), the thickness of the InP layer 306a is set to 41 nm (optical film thickness: 129 nm).

Further, the InGaAs photoelectric conversion layer 304 is arranged at a position immediately below the uppermost InGaAsP layer 305a in the present example so as to be positioned at the anti-node of the light intensity distribution. The anti-node of the light intensity distribution in the present disclosure is not used to mean only the maximum value of the amplitude of the light intensity distribution.

Figure 14A:
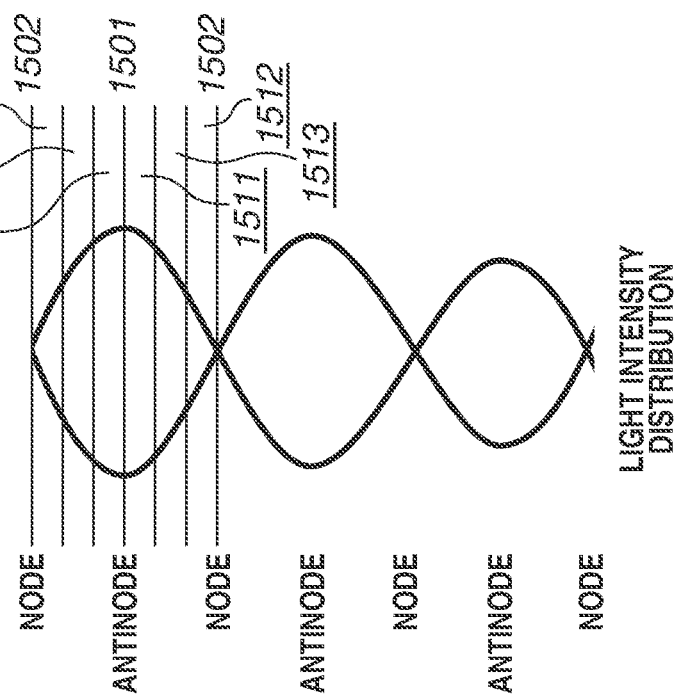
FIGS. 14A and 14B further illustrate the example 1.

For example, as illustrated in FIG. 14A, in a case where the range from a maximum value 1501 to a minimum value 1502 of the amplitude of the light intensity distribution is divided into two regions of a first region 1511 on the maximum value side and a second region 1512 on the minimum value side, the range occupied by the first region 1511 will also be referred to as the anti-node of the light intensity distribution.

Figure 14B:
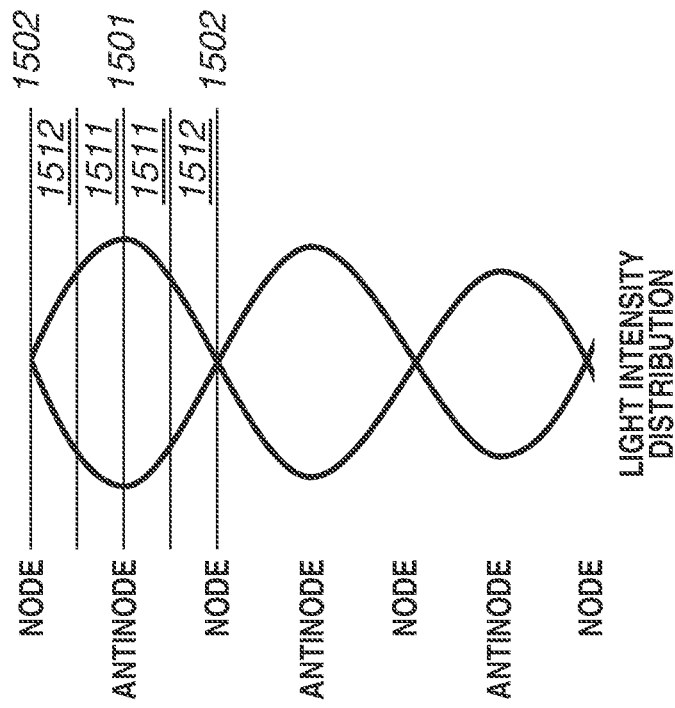

Alternatively, the anti-node of the light intensity distribution may be defined based on division into three regions as illustrated in FIG. 14B. More specifically, the range from the maximum value 1501 to the minimum value 1502 of the amplitude of the light intensity distribution is divided into the first region 1511 on the maximum value side, the second region 1512 on the minimum value side, and a third region 1513 between the first region 1511 and the second region 1512. In this case, the range occupied by the first region 1511 may also be referred to as the anti-node of the light intensity distribution. The present example indicates the example in which the center of gravity of the photoelectric conversion layer 304 belongs to the range occupied by the first region 1511 when the range from the maximum value 1501 to the minimum value 1502 is divided into the three regions.

The InGaAs photoelectric conversion layer 304 and the InGaAsP layer 305a and the InP layer 306a located above and under the InGaAs photoelectric conversion layer 304 are formed by i-type semiconductor layers.

On the substrate side thereof, the InGaAsP layers 305b and 305c, the InP layers 306b and 306c, and not-illustrated other semiconductor layers are formed by n-type semiconductors.

An upper electrode is formed on the resonator 302 and a lower electrode is formed on the InGaAsP layer 305b inside the first reflecting mirror 301 (not illustrated) to apply a voltage to the photoelectric conversion element. The lower electrode is not limited to being formed on the InGaAsP layer 305b, and may be formed anywhere at which the lower electrode can electrically contact the n-type semiconductor layer.

According to the configuration of the present example, the photoelectric conversion element allows the distance to be secured between the interface between the resonator 302 and the second reflecting mirror 303 and the photoelectric conversion layer 304, thereby being able to reduce the influence on the photoelectric conversion layer 304.

The photoelectric conversion sensitivity ratio was obtained by a simulation. Assuming that the photoelectric conversion sensitivity was 1 when the resonator length was set to 1.0λ and the center of gravity of the photoelectric conversion layer 304 was arranged at the position of the anti-node of the light intensity distribution in the resonator, the configuration according to the present example exhibited a photoelectric conversion sensitivity ratio of 0.87.

Further, the degree of metal diffusion was estimated based on a result of a component analysis in the depth direction of an actually manufactured device. Assuming that the degree of metal diffusion was 1 when the center of gravity of the photoelectric conversion layer 304 was arranged at the position of the anti-node of the light intensity distribution in the resonator, the configuration according to the present example exhibited a degree of metal diffusion of 0.003. From these results, according to the above-described configuration, the photoelectric conversion element can reduce the influence of the metal diffusion from the surface to an extremely low level while limiting the reduction in the photoelectric conversion sensitivity ratio to a certain range.

An example when the resonator length is increased will be described as a comparative example. It is the 1.5λ resonator that the photoelectric conversion layer is located at a similar position to the present example as the distance from the surface of the semiconductor. The photoelectric conversion sensitivity ratio is 0.79 in this configuration according to the table 1, and employing the configuration according to the present example can suppress the reduction amount of the photoelectric conversion sensitivity even when the photoelectric conversion layer is located at a similar distance from the semiconductor surface.

In the present example, the upper side of the photoelectric conversion layer 304 is the InGaAsP layer 305a, and therefore has a small band gap difference from the photoelectric conversion layer 304 compared to the InP layer 306a. Therefore, in a case where a dark current due to thermal excitation of carries is desired to be reduced, a carrier block layer may be disposed with a film thickness not causing this layer to generate an optical significant influence. More specifically, an InP layer thin enough to be able to be deposited stably by epitaxial grown or a layer made from a material having a larger band gap than that may be set up near the interface with the photoelectric conversion layer 304 in the InGaAsP layer 305a.

Other Configuration Examples

In the present example, the example has been described in which a part of the InP layer 306a, which is the low-refractive-index layer forming the first reflecting mirror 301, is replaced with the photoelectric conversion layer 304. The InGaAs layer used as the photoelectric conversion layer 304 has a high refractive index, and therefore this replacement may lead to a reduction in the reflectance of the first reflecting mirror 301. If the reduction in the reflectance becomes a problem, a part of the InGaAsP layer 305a, which is the layer having the high refractive index, may be replaced with the photoelectric conversion layer 304 as illustrated in FIG. 2C.

In this case, the thickness of the i-type InGaAsP layer 305a on the photoelectric conversion layer 304 reduces, and therefore only a part of the resonator 302 on the substrate 300 side may be formed by an i-type semiconductor if the influence of the diffusion of the dopant from the semiconductor layer forming the resonator 302 becomes a problem. Further, if the thickness of the i-type InP layer 306a under the photoelectric conversion layer 304 is too thick, only a part of the InP layer 306a on the substrate 300 side may be formed by an n-type semiconductor.

Figure 3:
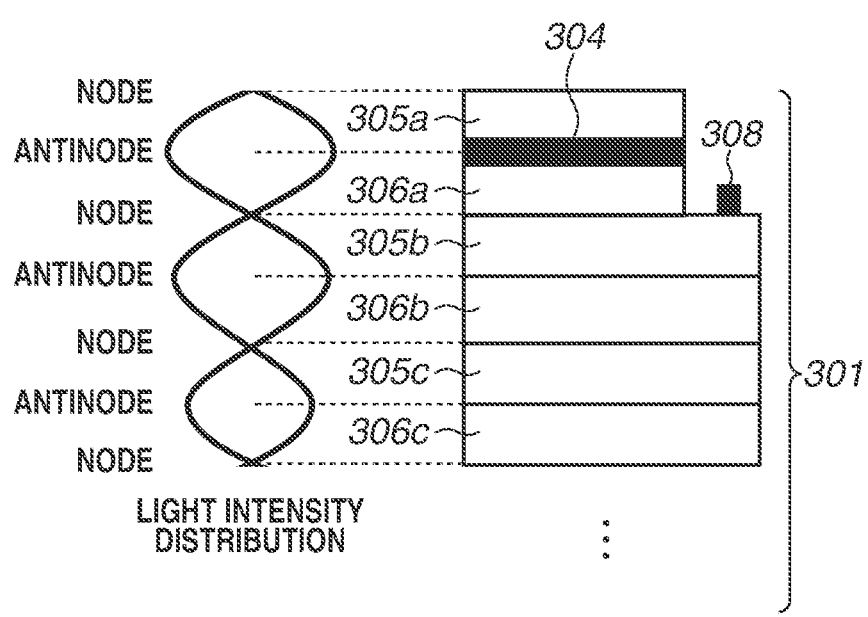
FIG. 3 illustrates an example 2.

FIG. 3 illustrates a photoelectric conversion element according to an example 2. FIG. 3 is a diagram corresponding to FIG. 2B or 2C. The example 2 is different in terms of the position at which the photoelectric conversion layer 304 is disposed compared to the example 1. More specifically, in the present example, the position of the center of gravity of the photoelectric conversion layer 304 is located at the interface between the uppermost InGaAsP layer 305a and the uppermost InP layer 306a, i.e., at the position of the maximum value of the light intensity distribution in the first reflecting mirror 301. In this case, the photoelectric conversion layer 304 and the InP layer 306a are configured in such a manner that the optical film thickness as a sum of a half of the optical film thickness of the photoelectric conversion layer 304 and the optical film thickness of the InP layer 306a has a design value equal to the optical film thicknesses of the other InP layers 306. Further, similarly, the photoelectric conversion layer 304 and the InGaAsP layer 305a are configured in such a manner that the optical film thickness as a sum of a half of the optical film thickness of the photoelectric conversion layer 304 and the optical film thickness of the InGaAsP layer 305a has a design value equal to the optical film thicknesses of the other InGaAsP layers 305. According to the configuration of the present example, the photoelectric conversion element can enhance the effect of the light intensity distribution, thereby improving the sensitivity, compared to the example 1.

In the present example, the example of a case where the center of gravity of the photoelectric conversion layer 304 is located at the position of the maximum value of the light intensity distribution has been described, but it is not limited thereto as long as the center of gravity of the photoelectric conversion layer 304 is located at a position near the position of the maximum value of the light intensity distribution.

More specifically, assuming that d represents the thickness of the photoelectric conversion layer 304, desirably, the center of gravity of the photoelectric conversion layer 304 is located at a distance of d/2 or shorter from the position of the maximum value of the light intensity distribution. Arranging the photoelectric conversion layer 304 in this range allows the photoelectric conversion element to further acquire an advantageous effect of increasing the photoelectric conversion sensitivity by the light intensity distribution compared to the example 1.

Figure 4A:
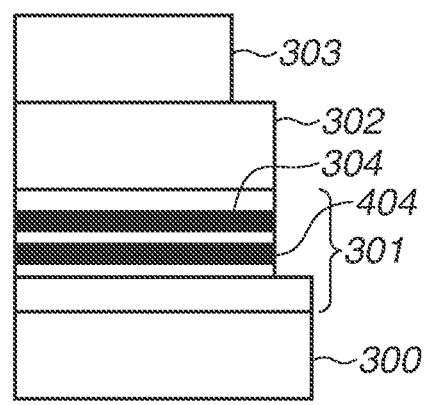
FIGS. 4A and 4B illustrate an example 3.
Figure 4B:
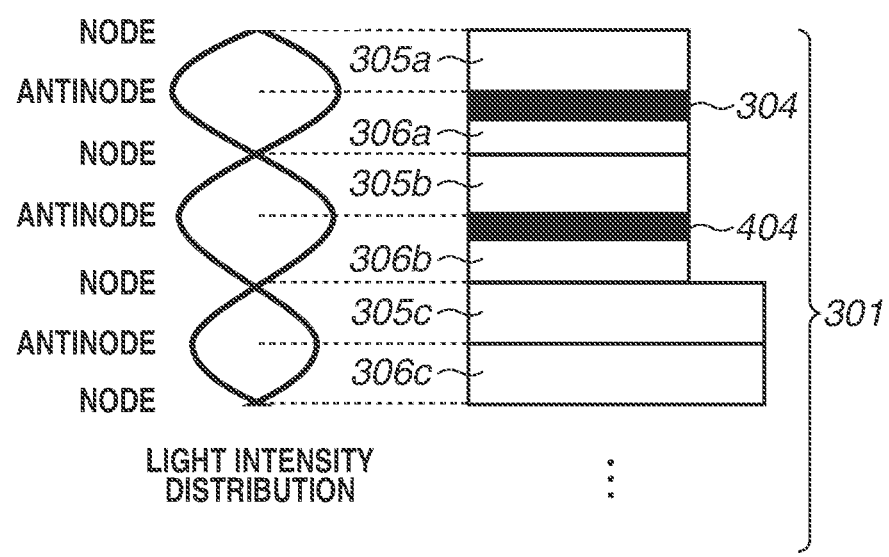

FIGS. 4A and 4B illustrate a photoelectric conversion element according to an example 3. As illustrated in FIG. 4A, the example 3 is different in terms of the number of layers of the photoelectric conversion layer 304 compared to the example 1. More specifically, the first photoelectric conversion layer 304 and a second photoelectric conversion layer 404 are provided in the present example.

Each of the photoelectric conversion layers 304 and 404 is disposed at the anti-node of a light standing wave in the InP layer 306, which is the layer having the low refractive index, in the first reflecting mirror 301. With the configuration of the present example, the photoelectric conversion element has a larger volume of the photoelectric conversion layer and therefore improves the sensitivity compared to the example 1, which is a case where the photoelectric conversion element includes the single photoelectric conversion layer 104.

In the present example, the example of a case where the two photoelectric conversion layers 304 and 404 are provided has been described, but three or more photoelectric conversion layers may be provided if the sensitivity is insufficient. In this case, desirably, the photoelectric conversion layer is disposed at the anti-node of the light intensity distribution in the first reflecting mirror 301.

Further, regarding the positions of the photoelectric conversion layers 304 and 404, each of the photoelectric conversion layers 304 and 404 may be positioned at the anti-node of the light intensity distribution in the InGaAsP layer 305, which is the layer having the high refractive index, or the anti-node of the light intensity distribution between the InGaAsP layer 305 and the InP layer 306. Further, the photoelectric conversion layer 304 and the photoelectric conversion layer 404 may be disposed at different positions. For example, the photoelectric conversion layer 304 may be disposed in the layer having the low refractive index and the photoelectric conversion layer 404 may be disposed in the layer having the high refractive index.

Figure 5:
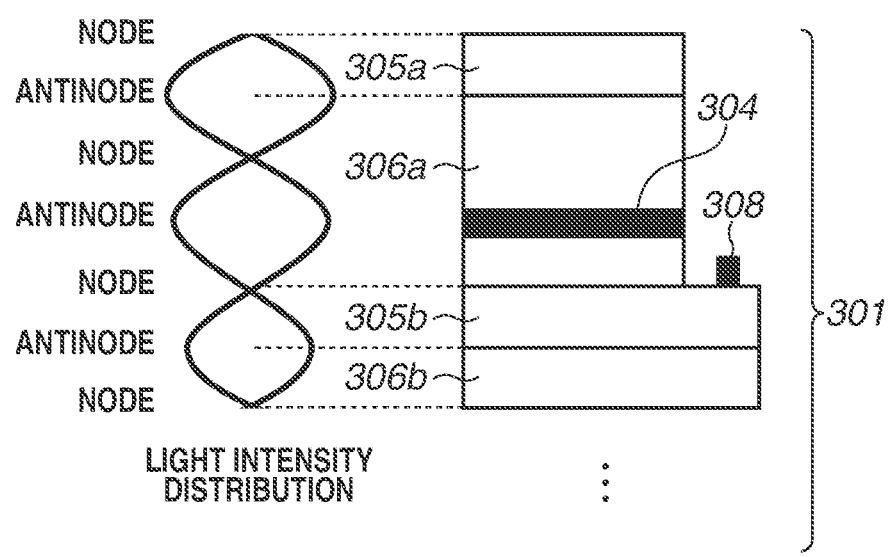
FIG. 5 illustrates an example 4.

FIG. 5 illustrates a photoelectric conversion element according to an example 4. With respect to at least one layer among the layers forming the first reflecting mirror 301 in which the photoelectric conversion layer 304 is inserted, the thickness is changed in such a manner that the position of the maximum value of the light intensity distribution is located within this layer in the present example as illustrated in FIG. 5. This configuration allows the center of gravity of the photoelectric conversion layer 304 to be positioned at the position of maximum value of the anti-node of the standing wave, thereby being able to further suppress the reduction in the photoelectric conversion sensitivity ratio, compared to the example 1.

In FIG. 5, among the plurality of layers forming the first reflecting mirror 301, the InGaAsP layer 305 and the InP layer 306 have approximately the same design values of the optical film thicknesses, but only the InP layer 306a therein has a thicker optical film thickness than the other InP layers (306b and the like). More specifically, the InP layer 306a has an optical film thickness approximately three times as thick as the other layers. Employing such a configuration allows the maximum value of the light intensity distribution to be located inside the InP layer 306a.

More specifically, i-type layers are used to form the photoelectric conversion layer 304, and a part of the InP layer 306a that is a layer above and under the conversion layer 304. More specifically, an i-type layer is used to form the InP layer 306a corresponding to a thickness of approximately 50 nm from the photoelectric conversion layer 304 toward the lower side (substrate 300 side), and an n-type layer is used to form the lower side thereof. Further, an i-type layer is used to form the InP layer 306a corresponding to a thickness of approximately 100 nm from the photoelectric conversion layer 304 toward the upper side, and an n-type layer is used to form the upper side thereof.

When the calculation was carried out using the simulation described in the example 1, the present example exhibited a photoelectric conversion sensitivity ratio of 0.92. Further, when the estimation method described in the example 1 was used, the present example exhibited a degree of metal diffusion of 0.003 or lower.

In the present example, the example of a case where the single photoelectric conversion layer 304 is provided has been described, but the number of layers of the photoelectric conversion layer may be increased. Desirably, the positions of the second photoelectric conversion layer and photoelectric conversion layers subsequent thereto are also disposed at the position of the maximum value of the light intensity distribution.

Further, the optical film thickness of a part of the InP layers 306 is set to be thick in the present example, and, similarly, the optical film thickness of a part of the InGaAsP layers 305 may be set to be thick and the photoelectric conversion layer 304 may be disposed in such a manner that the center of gravity of the photoelectric conversion layer 304 is located at the position of the maximum value of the light intensity distribution herein. For example, when the thickness of the InGaAsP layer 305a, which was the uppermost layer in the first reflecting mirror 301, was increased and the photoelectric conversion layer 304 was disposed in such a manner that the center of gravity of the photoelectric conversion layer 304 was located at the position of the maximum value of the light intensity distribution formed therein, 0.95 was obtained as the photoelectric conversion sensitivity ratio. Further, the degree of metal diffusion in the present example was 0.007.

In the present example, the example of a case where the center of gravity of the photoelectric conversion layer 304 is located at the position of the maximum value of the light intensity distribution has been described, but it is not limited thereto as long as the center of gravity of the photoelectric conversion layer 304 is located at a position near the maximum value of the light intensity distribution. More specifically, assuming that d represents the thickness of the photoelectric conversion layer 304, desirably, the center of gravity of the photoelectric conversion layer 304 is located at the distance of d/2 or shorter from the position of the maximum value of the light intensity distribution. Arranging the photoelectric conversion layer 304 in this range allows the photoelectric conversion element to further obtain an advantageous effect of increasing the photoelectric conversion sensitivity by the light intensity distribution compared to the example 1.

Further, in the present example, the optical thickness of the InP layer 306a in which the photoelectric conversion layer 304 is disposed is set to approximately three times as thick as the thicknesses of the other layers, i.e., approximately 3λ/4, but the disclosure is not limited thereto. The optical thickness may be set differently as long as it satisfies the following inequality (7), assuming that T represents the optical film thickness of the thickened layer (the thick layer).

$$\frac{(2P+1)}{4}\lambda b - \frac{1}{8}\lambda b \le T \le \frac{(2P+1)}{4}\lambda b + \frac{1}{8}\lambda b \quad (7)$$

(P is an integer equal to or larger than 1)
In this inequality, λb represents the design optical wavelength of the first reflecting mirror 301. For example, in a case of P=1, the optical film thickness of the thick film falls within a range from 5λ/8 to 7λ/8, and the optical film thickness of 3λ/4 belongs to this range. On the other hand, in a case of P=2, the optical film thickness of the thick film falls within a range from 9λ/8 to 11λ/8. The optical film thickness belonging to this range is, for example, 5λ/4.

Further, the following inequality is presented as an inequality that further limits the range of T expressed by the above-described inequality (7).

$$\frac{(2P+1)}{4}\lambda b - \frac{1}{16}\lambda b \le T \le \frac{(2P+1)}{4}\lambda b + \frac{1}{16}\lambda b \quad (8)$$

(P is an integer equal to or larger than 1)
More specifically, the above-described inequality (7) is an inequality indicating the optical film thickness of (optical film thickness based on the typical model)±λ/8, while the above-described inequality (8) is an inequality indicating the optical film thickness of (optical film thickness based on the typical model)±λ/16, and serves as an inequality that further limits the range of the optical film thickness T.

In the present example, the photoelectric conversion element includes the photoelectric conversion layer 304 disposed near the position of the maximum value of the light intensity distribution, thereby being able to further improve the photoelectric conversion sensitivity, compared to the example 1. Further, in the present example, the photoelectric conversion element includes a smaller number of layers forming the DBR, thereby leading to a reduction in a loss of the light due to the reflection between the different layers and thus being able to further improve the photoelectric conversion sensitivity, compared to the example 1.

Figure 6:
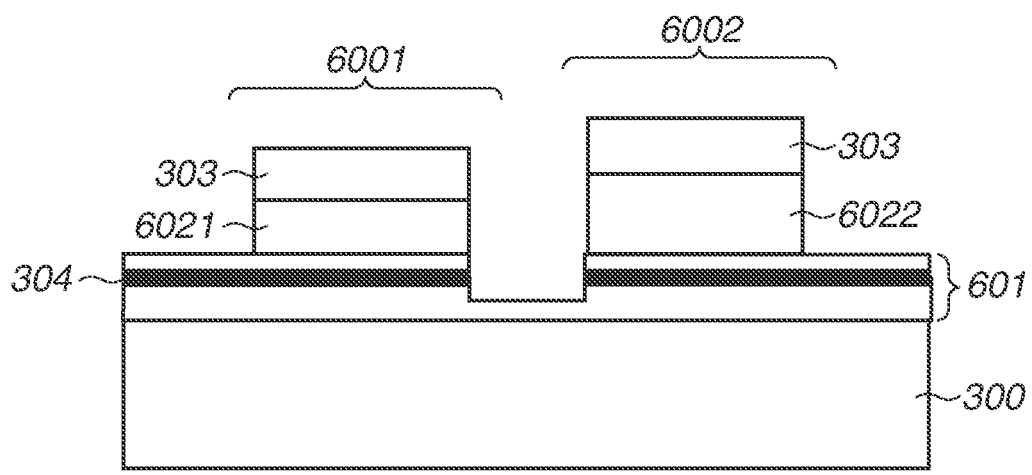
FIG. 6 illustrates an example 5.

FIG. 6 illustrates a photoelectric conversion element according to an example 5. In the present example, the photoelectric conversion element includes a first photoelectric conversion element 6001 with 1.50 µm as a first detection wavelength, and a second photoelectric conversion element 6002 with 1.55 µm as a second detection wavelength.

A first reflecting mirror 601 is provided, formed, disposed, positioned, or located on the InP substrate 300. The first reflecting mirror 601 is formed by an alternately layered film of InP layers and InGaAsP layers, and the design wavelength thereof is 1.52 µm. The i-type InGaAs photoelectric conversion layer 304 having the thickness of 70 nm is formed at the position of the anti-node of the light intensity distribution so as to replace a part of the alternately layered film in the first reflecting mirror 601. An alternately layered film belonging to a range of approximately 50 nm from below the InGaAs photoelectric conversion layer 304 is formed by an i-type semiconductor layer. Further, an alternately layered film located on the substrate side (lower side) with respect to the alternately layered film formed by the i-type semiconductor layer is formed by an n-type semiconductor layer. An alternately layered film belonging to a range of approximately 100 nm from above the InGaAs photoelectric conversion layer 304 is formed by an i-type semiconductor layer. Further, an alternately layered film located on the opposite side (upper side), with respect to the substrate, of the alternately layered film formed by the i-type semiconductor layer is formed by a p-type semiconductor layer.

A first p-type resonator 6021 is provided, formed, disposed, positioned, or located on the first reflecting mirror 601 in the portion of the first photoelectric conversion element 6001, and a second p-type resonator 6022 is provided, formed, disposed, positioned, or located on the first reflecting mirror 601 in the portion of the second photoelectric conversion element 6002. The second reflecting mirror 303 is formed on each of the first p-type resonators 6021 and 6022. Both of the two second reflecting mirrors 303 are dielectric DBRs formed by alternately layered films of $TiO_2$ and $SiO_2$. Further, upper electrodes electrically connected to the p-type resonators 6021 and 6022, and a common lower electrode electrically connected to the n-type semiconductor layer are provided, although they are not illustrated.

Each of the p-type resonators 6021 and 6022 is basically formed by a p-type InP layer, but contains a p-type InGaAsP layer as an etching stop layer in a part thereof. More specifically, a p-type InP layer of 452 nm, a p-type InGaAsP layer of 30 nm, and a p-type InP layer of 40 nm are formed in this order from the substrate side. The upper InP layer and the InGaAsP layer are removed from the first p-type resonator 6021 by wet etching, and the optical film thickness thereof is reduced to 1.50 µm. These layers are not removed from the second p-type resonator 6022, and the optical film thickness thereof remains 1.55 µm. Each resonator length can be accurately formed by continuously depositing the layers from the substrate side to the resonator portion by epitaxial growth, and removing only the upper layer of the resonator portion by the etching process. Further, the second reflecting mirrors 303 thereon are formed by the DBRs having the same layer structures for the photoelectric conversion elements that detect the plurality of different wavelengths. Therefore, the photoelectric conversion elements capable of detecting the plurality of wavelengths can be manufactured monolithically, at low cost, and with high accuracy.

The upper electrode is formed immediately above the resonator, and therefore the photoelectric conversion layer 304 may incur damage due to metal diffusion caused by a temperature increase during the process or the process if the photoelectric conversion layer 304 is located in the resonator. Further, employing the configurations described in the above-described examples 1 to 4 allows the photoelectric conversion element to reduce the influence on the photoelectric conversion layer 304 while keeping the reduction amount of the photoelectric conversion sensitivity to a low level.

Figure 7A:
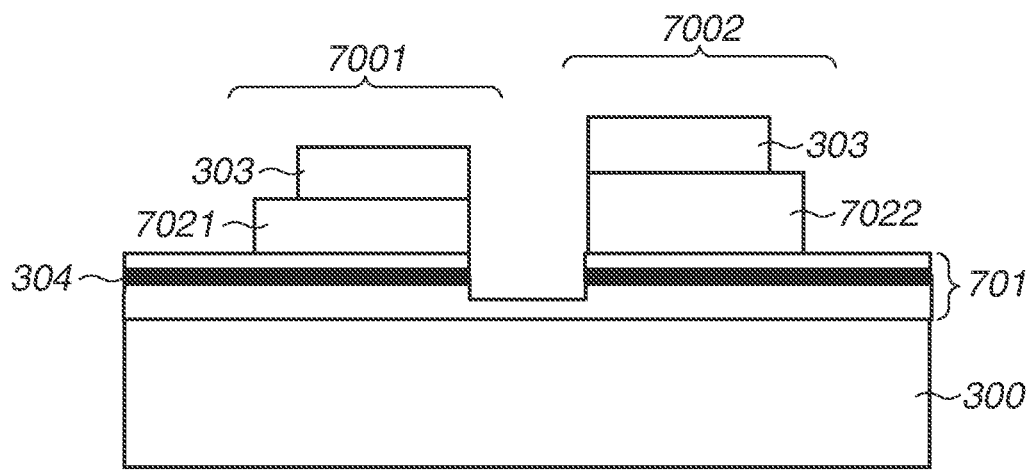
FIGS. 7A and 7B illustrate an example 6.
Figure 7B:
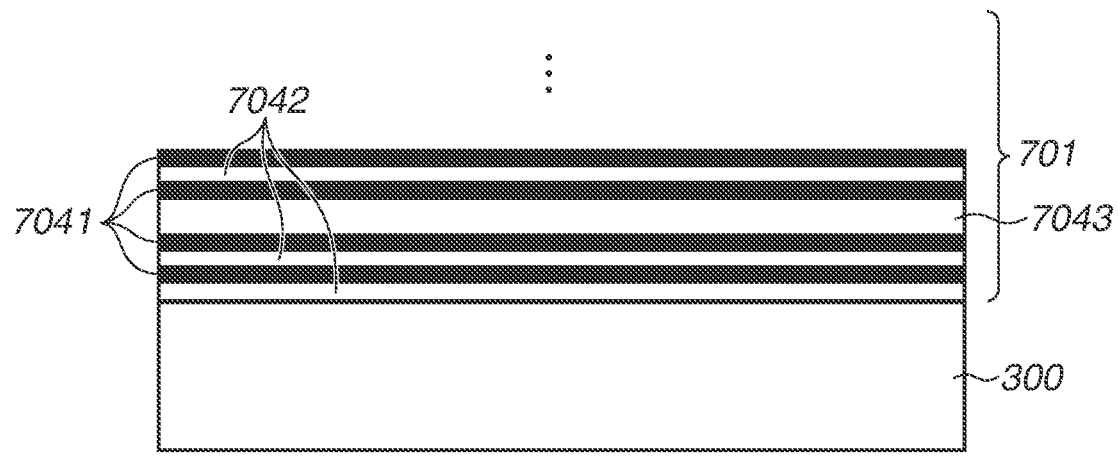

FIGS. 7A and 7B illustrate a photoelectric conversion element according to an example 6. While the first detection wavelength is assumed to be 1.50 µm and the second detection wavelength is assumed to be 1.55 µm in the example 5, but the first detection wavelength is assumed to be 1.40 µm and the second detection wavelength is assumed to be 1.60 µm in the present example. In other words, the difference between the two wavelengths is 50 nm in the example 5, but the difference between the two wavelengths is as large as 200 nm in the present example. Therefore, the reflection band cannot be realized for these two wavelengths with a normal DBR.

A first reflecting mirror 701 is provided, formed, disposed, positioned, or located on the InP substrate 300. The first reflecting mirror 701 is basically formed by an alternately layered film of InP layers and InGaAsP layers, and the design wavelength thereof is 1.52 µm. The i-type InGaAs photoelectric conversion layer 304 having the thickness of 70 nm is formed at the position of the anti-node of the light intensity distribution so as to replace a part of the alternately layered film in the first reflecting mirror 701 in the above-described manner. An alternately layered film belonging to a range of approximately 50 nm from below the InGaAs photoelectric conversion layer 304 in the first reflecting mirror 701 is formed by an i-type semiconductor layer. Further, an alternately layered film located on the substrate side (lower side) with respect to the alternately layered film formed by the i-type semiconductor layer is formed by an n-type semiconductor layer. An alternately layered film belonging to a range of approximately 100 nm from above the InGaAs photoelectric conversion layer 304 is formed by an i-type semiconductor layer. Further, an alternately layered film located on the opposite side (the upper side), with respect to the substrate, of the alternately layered film formed by the i-type semiconductor layer is formed by a p-type semiconductor layer.

A first p-type resonator 7021 is provided, formed, disposed, positioned, or located on the first reflecting mirror 701 in the portion of a first photoelectric conversion element 7001, and a second p-type resonator 7022 is provided, formed, disposed, positioned, or located on the first reflecting mirror 701 in the portion of a second photoelectric conversion element 7002.

The second reflecting mirror 303 is formed on each of the first p-type resonators 7021 and 7022. The second reflecting mirror 303 is configured in a similar manner to the configuration described in the example 5. Further, the upper electrode and the lower electrode are also configured in a similar manner to the configuration described in the example 5, although they are not illustrated.

Each of the resonators 7021 and 7022 is basically formed by a p-type InP layer, but contains a p-type InGaAsP layer as an etching stop layer in a part thereof. More specifically, a p-type InP layer of approximately 410 nm, a p-type InGaAsP layer of approximately 30 nm, and a p-type InP layer of approximately 100 nm are formed in this order from the substrate side.

The upper InP layer and the InGaAsP layer are removed from the first p-type resonator 7021 by wet etching, and the optical film thickness thereof is reduced to 1.40 µm. These layers are not removed from the second p-type resonator 7022, and the optical film thickness thereof remains 1.60 µm.

FIG. 7B illustrates the configuration of the first reflecting mirror 701. FIG. 7B illustrates a part of the layers forming the first reflecting mirror 701. Further, FIG. 7B illustrates the substrate 300 and the lower portion of the first reflecting mirror 701.

The first reflecting mirror 701 is formed by alternately layering an InGaAsP layer 7041 having a thickness of approximately 110 nm and an InP layer 7042 having a thickness of approximately 120 nm, and each layer has an optical film thickness equivalent to a quarter of 1520 nm in wavelength. In other words, the first reflecting mirror 701 is constructed based on the same thickness design as the normal DBR structure. However, the first reflecting mirror 701 is not completely constructed based on the same design idea as the normal DBR structure, and only an InP layer 7043 in the sixth pair from the substrate 300 side has a thickness of 210 nm.

Figure 8A:
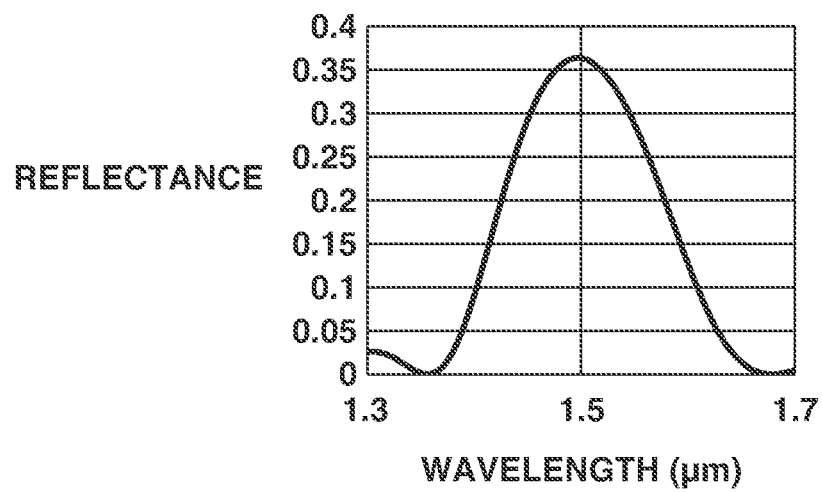
FIGS. 8A and 8B illustrate the example 6.
Figure 8B:
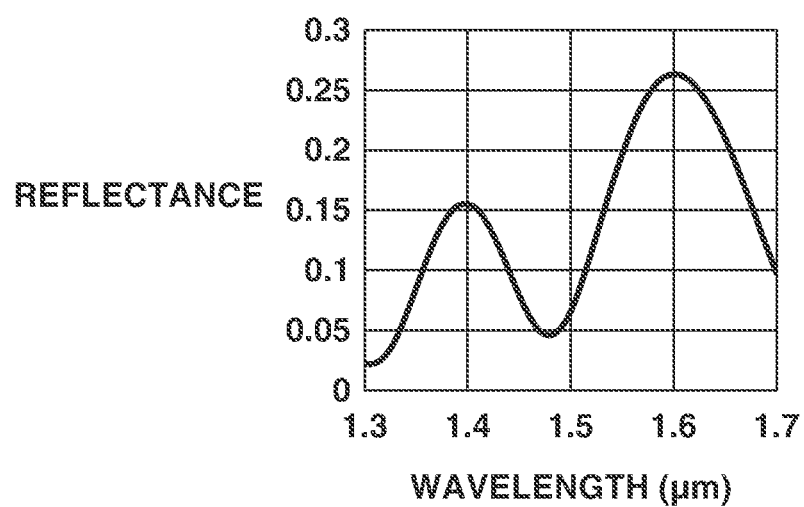

Next, the design of s reflectance spectrum of the first reflecting mirror 701 will be described in further detail. The first reflecting mirror 701 is configured in such a manner that only one layer in the normal DBR structure has a different thickness as described above. FIGS. 8A and 8B illustrate the reflection spectrum of the first reflecting mirror 701.

FIG. 8A illustrates the reflection spectrum in a case where the InP layer 7043 also has the λ/4 structure, i.e., the first reflecting mirror 701 has the normal DBR structure. In this case, the reflection spectrum is also the same as the normal DBR structure, and exhibits a spectrum shape peaked at the central wavelength. FIG. 8B illustrates the reflection spectrum in a case where the InP layer 7043 has the thickness of 210 nm resulting from increasing the thickness from λ/4 by 90 nm. In this case, the reflection spectrum exhibits such a shape that two maximum values appear side by side. More specifically, the reflection spectrum has a first reflectance peak corresponding to the first detection wavelength (1.40 µm) and a second reflectance peak corresponding to the second detection wavelength (1.60 µm). In this manner, changing the film thickness of the InP layer 7043 allows the two maximum values appearing in FIG. 8B to match the resonance wavelengths of the photoelectric conversion elements 7001 and 7002. Employing such a configuration can maximize the reflectances for separate specific two wavelengths with the minimum number of DBR layers, thereby maximizing the effect of the resonator.

Further, because the range around the maximum value of the reflectance spectrum is used, this configuration also brings about such an advantageous effect that, even when a difference is made between the resonance wavelength of each of the photoelectric conversion elements and the maximum value of the reflectance, a difference in the reflectance can be kept small. In the normal DBR like the example illustrated in FIG. 8A, the wavelengths of 1.4 µm and 1.6 µm used in the present example are located at positions where the reflectance spectrum has gradients. Therefore, if a difference is made in the resonance wavelength of the photoelectric conversion element around a position where the spectrum has a gradient, this leads to a difference in the reflectance of the reflecting mirror forming the resonator, resulting in an increase in the variation in the element characteristic of the photoelectric conversion element, i.e., the peak value of the specific spectral sensitivity. Therefore, desirably, the resonance wavelength is set to a position around the maximum value like the example illustrated in FIG. 8B.

In the above-described manner, each resonator length can be accurately formed by continuously depositing the layers from the substrate side to the resonator portion by epitaxial growth, and removing only the upper layer of the resonator portion by the etching process. Further, the second reflecting mirrors 303 thereon are formed by the DBRs having the same layer structures for the photoelectric conversion elements that detect the plurality of different wavelengths. Further, the first reflecting mirror 701 can maximize the reflectance at the separate specific two wavelengths with the minimum number of layers. Therefore, the photoelectric conversion elements capable of detecting the plurality of wavelengths can be manufactured monolithically, at low cost, and with high accuracy.

The upper electrode is formed immediately above the resonator, and therefore the photoelectric conversion layer 304 may incur damage due to metal diffusion caused by a temperature increase during the process or the process if the photoelectric conversion layer 304 is placed in the resonator. Further, employing the configurations described in the above-described examples 1 to 4 allows the photoelectric conversion element to reduce the influence on the photoelectric conversion layer 304 while keeping the reduction amount of the photoelectric conversion sensitivity to a low level.

Further, this configuration can reduce the influence from the surface of the semiconductor while keeping the reduction amount of the photoelectric conversion sensitivity to a low level, compared to the configuration in which the resonator length is increased. Especially, the increase in the resonator length would lead to a reduction in spacing between longitudinal modes, thereby undesirably resulting in generation of an unnecessary sensitivity peak between the two peaks that are the design wavelengths (1.4 µm and 1.6 µm in the case of the present example). However, arranging the photoelectric conversion layer 304 in the first reflecting mirror 701, like the present example, can create the photoelectric conversion element having light reception sensitivity only to the desired wavelength without the unnecessary peak generated between the two light reception peaks.

A phase adjustment layer is provided in a part of the lower reflecting mirror in the present example, but the disclosure is not limited thereto, and, for example, the photoelectric conversion element may be configured in such a manner that two DBR structures having different central wavelengths are layered to expand the band of the reflectance spectrum of the lower reflecting mirror.

Other Examples

The above-described examples are constructed using the semiconductor material that allows crystals to grow on the InP substrate. However, the material series forming the resonator-type photoelectric conversion element may be another semiconductor material series, such as a material series that allows crystals to grow on a GaAs substrate and a material series that allows crystals to grow on a GaSb substrate. In sum, the semiconductor material series can be selected arbitrarily depending on the detection wavelength band or the like.

Further, the types of wavelengths of the resonator-type photoelectric conversion element are the two types in the example 5 and the example 6, but the above-described configuration can also be achieved based on a similar idea even when the types of wavelengths are three or more types.

Further, regarding the reflecting mirror portion, the main layers in the DBR described in the above-described examples are formed by the high-refractive-index layer including a single film and the low-refractive-index layer including a single film, but each of the high-refractive-index layer and the low-refractive-index layer may be formed by a plurality of layers.

Figure 12:
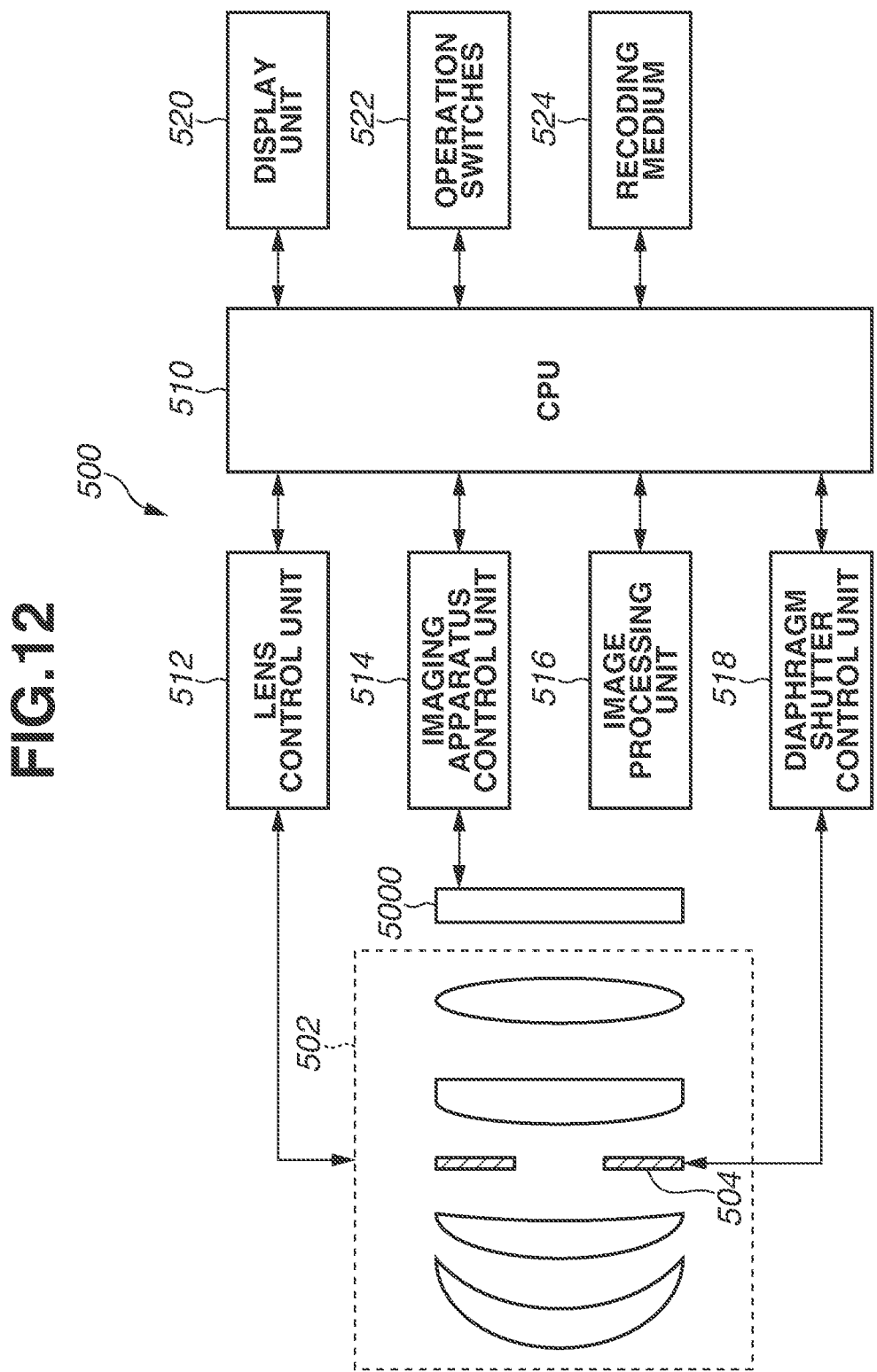
FIG. 12 is a block diagram illustrating a photoelectric conversion system according to a second exemplary embodiment.

An imaging system according to a second exemplary embodiment will be described with reference to FIG. 12. FIG. 12 is a block diagram illustrating a schematic configuration of the imaging system according to the present exemplary embodiment.

The photoelectric conversion apparatus described in the above-described exemplary embodiment is applicable to various imaging systems. The imaging systems to which the photoelectric conversion apparatus is applicable include, but are not especially limited to, various kinds of apparatuses such as a digital still camera, a digital camcorder, a monitoring camera, a copying machine, a facsimile machine, a mobile phone, an in-vehicle camera, an observation satellite, and a camera for medical use. Further, the imaging systems also include a camera module including an optical system such as a lens and the photoelectric conversion apparatus. FIG. 12 illustrates a block diagram of the digital still camera as an example thereof.

An imaging system 500 includes a photoelectric conversion apparatus 5000, an imaging optical system 502, a central processing unit (CPU) 510, a lens control unit 512, an imaging apparatus control unit 514, an image processing unit 516, a diaphragm shutter control unit 518, a display unit 520, operation switches 522, and a recording medium 524.

The imaging optical system 502 is an optical system for forming an optical image of a subject, and includes a lens group and a diaphragm 504. The diaphragm 504 has a function of adjusting a light amount at the time of capturing an image by adjusting an aperture diameter thereof, and, besides that function, also has a function as an exposure time adjustment shutter at the time of capturing a still image. The lens group and the diaphragm 504 are held so as to be able to advance and retract along the optical axis direction, and implement a magnification function (zoom function) and a focus adjustment function by their linked operations. The imaging optical system 502 may be integrated with the imaging system 500 or may be an imaging lens attachable to the imaging system 500.

The photoelectric conversion apparatus 5000 is disposed in an image space of the imaging optical system 502 so as to locate an imaging plane of the imaging optical system 502 on the photoelectric conversion apparatus 5000. The photoelectric conversion apparatus 5000 is the photoelectric conversion apparatus described in the above-described exemplary embodiment and the above-described examples. The photoelectric conversion apparatus 5000 photoelectrically converts the subject image formed by the imaging optical system 502, and outputs the converted image as an image signal or a focus detection signal.

The lens control unit 512 is used to control the driving of the advancement and retraction of the lens group in the imaging optical system 502 to perform the magnification operation and carry out the focus adjustment, and includes a circuit and a processing device configured to fulfill these functions. The diaphragm shutter control unit 518 is used to change the aperture diameter of the diaphragm 504 (changing the aperture value) to adjust the imaging light amount, and includes a circuit and a processing device configured to fulfill this function.

The CPU 510 is a control apparatus in the camera that is in charge of various kinds of control of the camera main body, and includes an arithmetic unit, a read only memory (ROM), a random access memory (RAM), an A/D converter, a digital-to-analog (D/A) converter, a communication interface circuit. The CPU 510 controls the operation of each unit in the camera based on a computer program recorded in the ROM or the like, and performs a series of imaging operations such as automatic focusing (AF) including detection of the focus state of the imaging optical system 502 (focus detection), imaging, image processing, and recording. The CPU 510 also functions as a signal processing unit.

The imaging apparatus control unit 514 is used to control the operation of the photoelectric conversion apparatus 5000, and also carry out the A/D conversion on a signal output from the photoelectric conversion apparatus 5000 and transmit the converted signal to the CPU 510, and includes a circuit and a control device configured to fulfill these functions. The photoelectric conversion apparatus 5000 may include the A/D conversion function. The image processing unit 516 is used to generate an image signal by performing image processing such as a γ conversion and color interpolation on the signal converted by the A/D conversion, and includes a circuit and a processing device configured to fulfill this function. The display unit 520 displays information regarding an imaging mode of the camera, a preview image before the imaging, an image for confirmation after the imaging, an in-focus state at the time of the focus detection, and the like. The operation switches 522 include a power source switch, a release (imaging trigger) switch, a zoom operation switch, an imaging mode selection switch, and the like. The recording medium 524 is used to record an already captured image and the like, and may be a medium built in the imaging system 500 or may be an attachable and detachable medium such as a memory card.

A high-performance imaging system can be achieved by configuring the imaging system 500 to which the photoelectric conversion apparatus 5000 described in the above-described exemplary embodiment is applied in this manner <Imaging System and Moving Object>

Figure 13A:
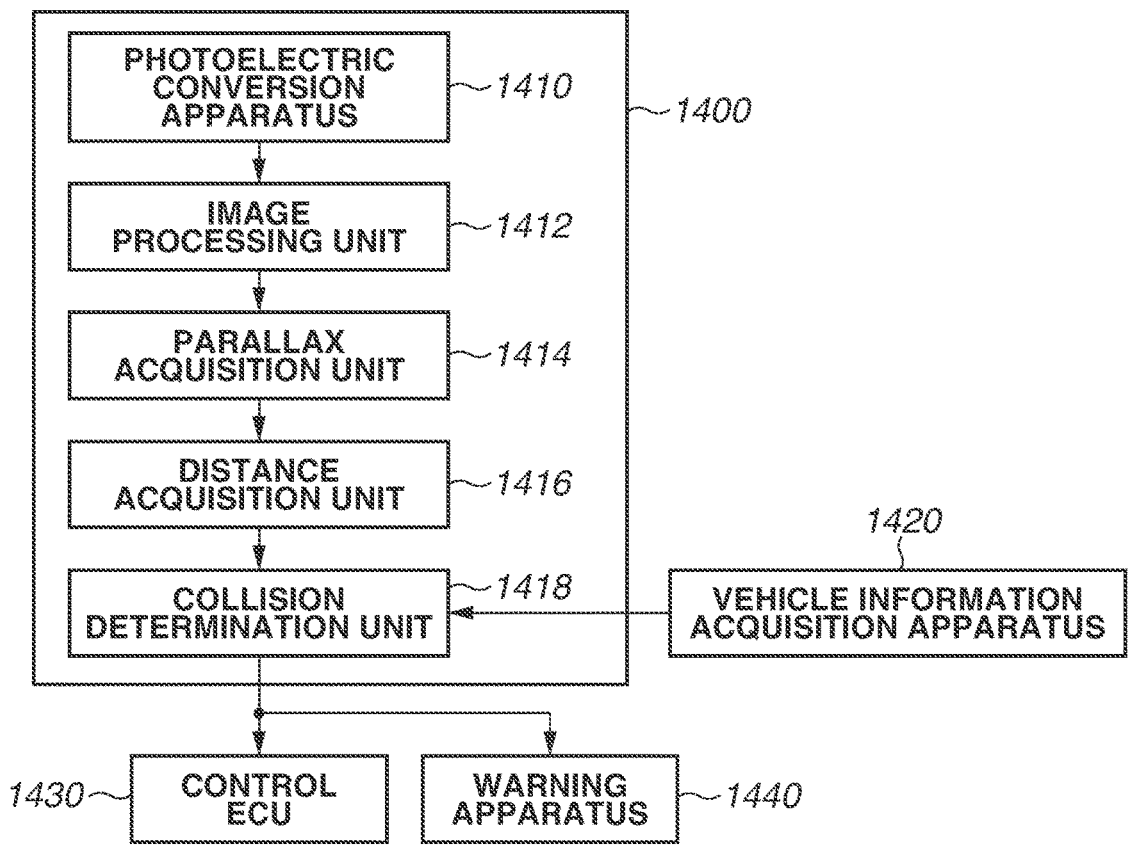
FIGS. 13A and 13B illustrate a photoelectric conversion system according to a third exemplary embodiment.
Figure 13B:
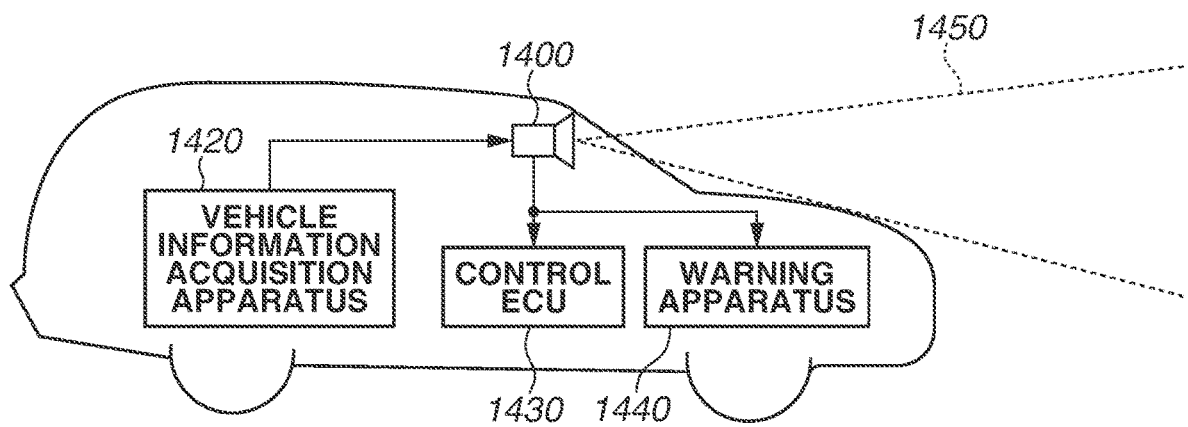

An imaging system and a moving object according to a third exemplary embodiment will be described with reference to FIGS. 13A and 13B. FIGS. 13A and 13B illustrate a configuration of the imaging system and the moving object according to the present exemplary embodiment.

FIG. 13A illustrates an example of an imaging system 1400 regarding the in-vehicle camera. The imaging system 1400 includes a photoelectric conversion apparatus 1410. The photoelectric conversion apparatus 1410 is any of the above-described photoelectric conversion apparatuses. The imaging system 1400 includes an image processing unit 1412, which is a processing apparatus that performs image processing on a plurality of pieces of image data acquired by the photoelectric conversion apparatus 1410. Further, the imaging system 1400 includes a parallax acquisition unit 1414, which is a processing apparatus that calculates a parallax from the plurality of pieces of image data acquired by the photoelectric conversion apparatus 1410. Further, the imaging system 1400 includes a distance acquisition unit 1416, which is a processing apparatus that calculates a distance to a target based on the calculated parallax, and a collision determination unit 1418, which is a processing apparatus that determines whether there is a collision possibility based on the calculated distance. The parallax acquisition unit 1414 and the distance acquisition unit 1416 are an example of an information acquisition unit that acquires information such as distance information to the target. In other words, the distance information refers to information regarding the parallax, a defocus amount, the distance to the target, and the like. The collision determination unit 1418 may determine the collision possibility using any of these pieces of distance information. The above-described various processing apparatuses may be implemented by hardware designed specially therefor or may be implemented by general-purpose hardware that carries out calculations based on a software module. Alternatively, the processing apparatuses may be implemented by a field programmable gate array (FPGA), an application specific integrated circuit (ASIC), or the like. Alternatively, the processing apparatuses may be implemented by a combination of them.

The imaging system 1400 is connected to a vehicle information acquisition apparatus 1420, and can acquire vehicle information, such as a vehicle speed, a yaw rate, and a steering angle. Further, the imaging system 1400 is also connected to a control electronic control unit (ECU) 1430, which is a control apparatus that outputs a control signal for generating a braking force on the vehicle based on a result of the determination by the collision determination unit 1418. In other words, the control ECU 1430 is an example of a moving object control unit that controls the moving object based on the distance information. Further, the imaging system 1400 is also connected to a warning apparatus 1440, which issues a warning to a driver based on the result of the determination by the collision determination unit 1418. For example, when the collision possibility is high as the result of the determination by the collision determination unit 1418, the control ECU 1430 controls the vehicle so as to avoid the collision or reduce damage by, for example, braking the vehicle, returning an accelerator, and/or reducing an engine output. The warning apparatus 1440 warns the user by, for example, sounding a warning such as a sound, displaying warning information on a screen of a car navigation system or the like, and/or vibrating a seat belt or a steering wheel.

In the present exemplary embodiment, surroundings of the vehicle such as a scenery in front of or behind the vehicle are imaged by the imaging system 1400. FIG. 13B illustrates the imaging system 1400 in a case where the imaging system 1400 images the scenery in front of the vehicle (imaging range 1450). The vehicle information acquisition apparatus 1420 transmits an instruction to cause the imaging system 1400 to operate and carry out the imaging. The imaging system 1400 according to the present exemplary embodiment can further improve the accuracy of the distance measurement by using the photoelectric conversion apparatus described in the above-described exemplary embodiment as the photoelectric conversion apparatus 1410. Further, the imaging system 1400 may control the vehicle based on image recognition without carrying out the distance measurement.

In the above description, the imaging system 1400 has been described referring to the example that performs control so as to prevent the vehicle from colliding with another vehicle, but is also applicable to control for autonomously driving the vehicle so as to cause the vehicle to follow the other vehicle, control for autonomously driving the vehicle so as to prevent the vehicle from departing from a traffic lane, and the like. Further, the imaging system 1400 is applicable to not only the vehicle such as an automobile, but also a moving object (transportation apparatus) such as a ship, an airplane, or an industrial robot. A movement apparatus in the moving object (transportation apparatus) is various kinds of movement units, such as an engine, a motor, a wheel, and a propeller. In addition, the imaging system 1400 is applicable to not only the moving object but also an apparatus widely utilizing object recognition, such as an intelligent transportation system (ITS).

Besides that, the above-described exemplary embodiments and examples are mutually replaceable within the range that satisfies the problem-solving principle of the disclosure.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-236001, filed Dec. 26, 2019, which is hereby incorporated by reference herein in its entirety.

What is claimed is:

1. A photoelectric conversion element comprising:
a photoelectric conversion layer;
a first reflecting mirror disposed on a substrate;
a resonator provided on the first reflecting mirror; and
a second reflecting mirror provided on the resonator,
wherein the first reflecting mirror includes a distributed Bragg reflector (DBR) including a plurality of semiconductor layers,
wherein the photoelectric conversion layer is disposed in at least one layer of the plurality of semiconductor layers,
wherein the photoelectric conversion layer is an i-type semiconductor,
wherein the plurality of semiconductor layers include a first layer immediately above the photoelectric conversion layer and a second layer immediately below the photoelectric conversion layer, and
wherein each of the first layer and the second layer are an i-type semiconductor.

2. The photoelectric conversion element according to claim 1, wherein an optical film thickness L of the resonator satisfies a condition expressed by inequality (1), $$\frac{3}{8}\lambda 0 + \frac{m}{2}\lambda 0 \le L \le \frac{5}{8}\lambda 0 + \frac{m}{2}\lambda 0$$

(m is an integer equal to or larger than 0) . . . (1),
where λ0 represents a wavelength to which sensitivity is maximized when a sensitivity characteristic is acquired with respect to the photoelectric conversion element.

3. The photoelectric conversion element according to claim 2, wherein the optical film thickness L of the resonator satisfies a condition expressed by inequality (2), $$\frac{7}{8}\lambda 0 \le L \le \frac{9}{8}\lambda 0. \qquad (2)$$

4. The photoelectric conversion element according to claim 2, wherein the optical film thickness L of the resonator satisfies a condition expressed by inequality (3), $$\frac{3}{8}\lambda 0 \le L \le \frac{5}{8}\lambda 0. \qquad (3)$$

5. The photoelectric conversion element according to claim 1,
wherein the second reflecting mirror is a DBR including a plurality of layers, and
wherein the plurality of layers includes a plurality of pairs each including a third layer and a fourth layer, the fourth layer having a different refractive index from a refractive index of the third layer.

6. The photoelectric conversion element according to claim 1,
wherein the second reflecting mirror includes a metallic film, and
wherein the metallic film includes a single layer or a plurality of layers.

7. The photoelectric conversion element according to claim 1,
wherein the DBR including the plurality of semiconductor layers includes a plurality of pairs each including a first semiconductor layer and a second semiconductor layer, the second semiconductor layer having a different refractive index from a refractive index of the first semiconductor layer, and
wherein the photoelectric conversion layer is provided by replacing a part of the first semiconductor layer and the second semiconductor layer in at least one pair among the plurality of pairs.

8. The photoelectric conversion element according to claim 1,
wherein the DBR including the plurality of semiconductor layers includes a plurality of pairs each including a first semiconductor layer and a second semiconductor layer, the second semiconductor layer having a different refractive index from a refractive index of the first semiconductor layer,
wherein, in at least one pair among the plurality of pairs, the first semiconductor layer has an optical film thickness thicker than an optical film thickness of λ0/4
where λ0 is a wavelength to which sensitivity is maximized when a sensitivity characteristic is acquired with respect to the photoelectric conversion element, and
wherein the photoelectric conversion layer is provided by replacing a part of the first semiconductor layer having the optical film thickness thicker than the optical film thickness of λ0/4.

9. The photoelectric conversion element according to claim 1, wherein the photoelectric conversion layer is disposed at an anti-node of a light intensity distribution generated in the photoelectric conversion element.

10. An imaging system comprising:
a photoelectric conversion apparatus including a plurality of the photoelectric conversion elements according to claim 1; and
a processing apparatus configured to process a signal output from the photoelectric conversion apparatus.

11. The photoelectric conversion element according to claim 1, wherein any semiconductor layer above the first layer is a semiconductor layer of a first conductivity type, and any semiconductor layer below the second layer is a semiconductor layer of a second conductivity type different from the first conductivity type.

12. The photoelectric conversion element according to claim 1, wherein the resonator is formed by a continuous film.

13. The photoelectric conversion element according to claim 12, wherein the continuous film is made from a single substance.

* * * * *